(12) United States Patent
Takao et al.

(10) Patent No.: US 9,214,459 B2
(45) Date of Patent: Dec. 15, 2015

(54) SEMICONDUCTOR DEVICE

(71) Applicant: Kabushiki Kaisha Toshiba, Minato-ku (JP)

(72) Inventors: Kazuto Takao, Tsukuba (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/458,396

(22) Filed: Aug. 13, 2014

(65) Prior Publication Data
US 2015/0155276 A1 Jun. 4, 2015

(30) Foreign Application Priority Data
Nov. 29, 2013 (JP) ................ 2013-248104

(51) Int. Cl.
*H01L 27/06* (2006.01)
*H01L 29/739* (2006.01)
*H01L 29/78* (2006.01)
(Continued)

(52) U.S. Cl.
CPC .......... *H01L 27/0635* (2013.01); *H01L 23/642* (2013.01); *H01L 25/072* (2013.01); *H01L 27/0629* (2013.01); *H01L 28/40* (2013.01); *H01L 29/7393* (2013.01);
(Continued)

(58) Field of Classification Search
CPC ......... H02M 7/537; H02M 7/53; H02M 7/48; B60L 3/03
USPC ................. 257/140; 363/131, 400.27, 56.05
See application file for complete search history.

(56) References Cited

U.S. PATENT DOCUMENTS

2005/0152101 A1* 7/2005 Rodriguez et al. ............ 361/605
2006/0108684 A1   5/2006 Stevanovic et al.
(Continued)

FOREIGN PATENT DOCUMENTS

DE            198 26 731 A1   12/1999
DE    10 2006 004 031 B3     3/2007
(Continued)

OTHER PUBLICATIONS

Fupet New Technology Eliminating Parasitic Vibration "Ringing", R & D Partnership for Future Power Electronics Technology, 2011, 3 pages.
(Continued)

*Primary Examiner* — Cuong Q Nguyen
*Assistant Examiner* — Tong-Ho Kim
(74) *Attorney, Agent, or Firm* — Oblon, McClelland, Maier & Neustadt, L.L.P.

(57) ABSTRACT

A semiconductor device of an embodiment includes: a substrate; circuit units arranged above the substrate, each of the circuit units including a first electrode, a second electrode, a first switching element and a second switching element electrically connected in series between the first electrode and the second electrode, a capacitor electrically connected in parallel to the first switching element and the second switching element between the first electrode and the second electrode, and an AC electrode connected between the first switching element and the second switching element; and a housing that encloses the circuit units. A common potential is applied to the first electrodes of the respective circuit units, a common potential is applied to the second electrodes of the respective circuit units, and the AC electrodes of the respective circuit units are connected to one another.

10 Claims, 4 Drawing Sheets

(51) Int. Cl.
  *H01L 49/02* (2006.01)
  *H01L 23/64* (2006.01)
  *H01L 25/07* (2006.01)
  *H02M 7/00* (2006.01)

(52) U.S. Cl.
  CPC .............. *H01L 29/78* (2013.01); *H02M 7/003* (2013.01); *H01L 2924/0002* (2013.01)

(56) References Cited

U.S. PATENT DOCUMENTS

| | | | |
|---|---|---|---|
| 2010/0327654 A1* | 12/2010 | Azuma et al. | ............... 307/9.1 |
| 2011/0285226 A1 | 11/2011 | Fujita et al. | |
| 2014/0084993 A1 | 3/2014 | Takao et al. | |
| 2014/0334102 A1* | 11/2014 | Tanaka et al. | ............... 361/699 |

FOREIGN PATENT DOCUMENTS

| | | |
|---|---|---|
| DE | 10 2008 054 923 A1 | 7/2010 |
| DE | 10 2010 006 850 A1 | 8/2011 |
| JP | 7-236281 | 9/1995 |
| JP | 2000-269416 | 9/2000 |
| JP | 2001-274322 | 10/2001 |
| JP | 2004-48823 | 2/2004 |
| JP | 2004-153897 | 5/2004 |
| JP | 2006-148098 | 6/2006 |
| JP | 2009-225612 | 10/2009 |
| JP | 2009-295633 | 12/2009 |
| JP | 2010-41828 | 2/2010 |
| JP | 2010-63355 | 3/2010 |
| JP | 2010-124691 | 6/2010 |
| JP | 2010-193713 | 9/2010 |
| JP | 2011-15460 | 1/2011 |
| JP | 2011-23570 | 2/2011 |
| JP | 2011-172442 | 9/2011 |
| JP | 2011-239679 | 11/2011 |
| JP | 2011-250491 | 12/2011 |
| JP | 2012-115128 | 6/2012 |
| JP | 2013-192367 | 9/2013 |
| JP | 2014-67760 | 4/2014 |
| KR | 10-1185894 | 9/2012 |
| TW | 201324744 A1 | 6/2013 |

OTHER PUBLICATIONS

Extended European Search Report issued May 11, 2015 in Patent Application No. 14178086.6.

Office Action issued Aug. 20, 2015 in Korean Patent Application No. 10-2014-0098980 (with English translation).

Office Action issued Sep. 11, 2015 in Taiwanese Patent Application No. 103125504 (with English translation).

* cited by examiner

SEMICONDUCTOR DEVICE

CROSS-REFERENCE TO RELATED APPLICATION

This application is based upon and claims the benefit of priority from Japanese Patent Application No. 2013-248104, filed on Nov. 29, 2013, the entire contents of which are incorporated herein by reference.

FIELD

Embodiments described herein relate generally to a semiconductor device.

BACKGROUND

SiC (silicon carbide) is expected to be a material for next-generation power semiconductor devices. SiC has excellent physical properties, having a band gap three times wider than that of Si (silicon), a breakdown field strength approximately 10 times higher than that of Si, and a heat conductivity approximately three times higher than that of Si. A power semiconductor device that has low loss and is capable of high-temperature operation can be realized by taking advantage of those properties.

However, in a power semiconductor module such as a voltage-type power conversion module, the problem of device breakdown due to overshoot voltage at turn-off becomes serious is switching operation becomes faster. The overshoot voltage at turn-off is proportional to the time rate (di/dt) of change in the current flowing in the circuit.

If the switching period is made longer so as to suppress overshoot, the switching operation becomes slower. Also, switching loss, which is expressed by the time integral of a product of current and voltage (∫ixvxdt), becomes larger. So as to suppress overshoot and reduce switching loss, the parasitic inductance of the power semiconductor module should be reduced.

DETAILED DESCRIPTION

Figure 1:
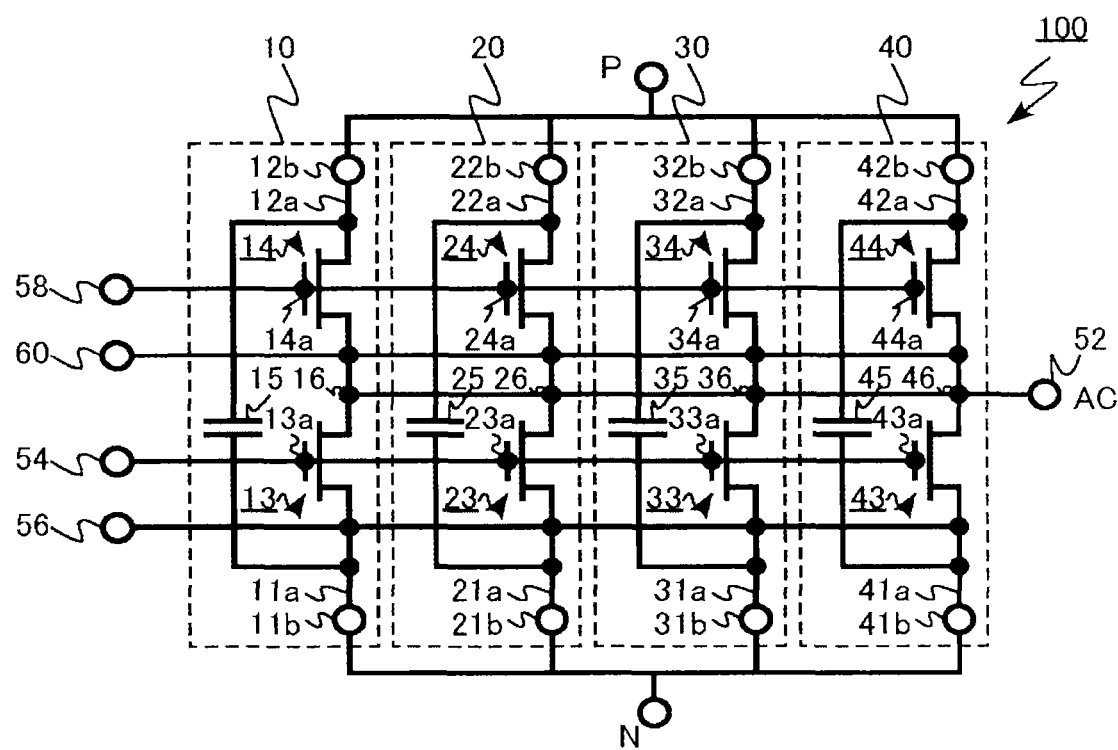
FIG. 1 is a circuit diagram of a semiconductor device of a first embodiment.

A semiconductor device of an embodiment includes: a substrate; circuit units arranged above the substrate, each of the circuit units including a first electrode, a second electrode, a first switching element and a second switching element electrically connected in series between the first electrode and the second electrode, a capacitor electrically connected in parallel to the first switching element and the second switching element between the first electrode and the second electrode, and an AC electrode connected between the first switching element and the second switching element; and a housing that encloses the circuit units, wherein a common potential is applied to the first electrodes of the respective circuit units, a common potential is applied to the second electrodes of the respective circuit units, and the AC electrodes of the respective circuit units are connected to one another.

The following is a description of embodiments, with reference to the accompanying drawings. In the following description, like components are denoted by like reference numerals, and explanation of components described once will not be repeated.

First Embodiment

A semiconductor device of this embodiment includes: a substrate; circuit units arranged on or above the substrate, each of the circuit units including a first electrode, a second electrode, a first switching element and a second switching element electrically connected in series between the first electrode and the second electrode, a capacitor electrically connected in parallel to the first switching element and the second switching element between the first electrode and the second electrode, and an AC electrode connected between the first switching element and the second switching element; and a housing that encloses the circuit units. A common potential is applied to the first electrodes of the respective circuit units, a common potential is applied to the second electrodes of the respective circuit units, and the AC electrodes of the respective circuit units are connected to one another.

Figure 2A:
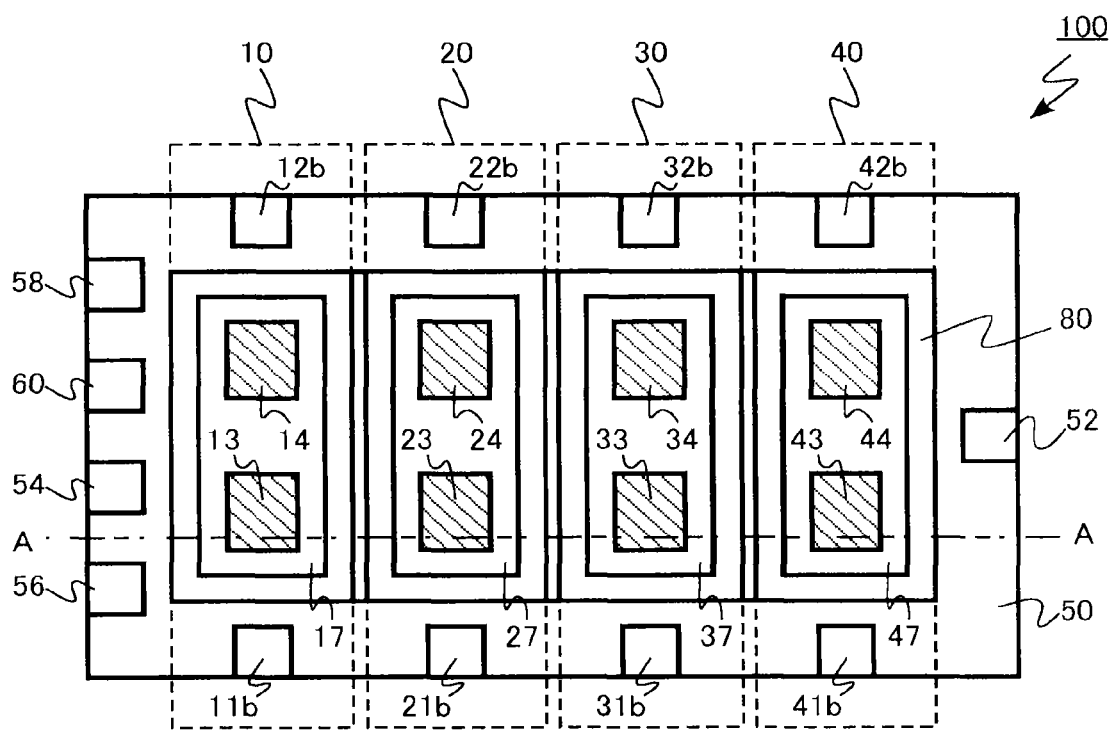
FIGS. 2A and 2B are schematic views of the semiconductor device of the first embodiment.
Figure 2B:
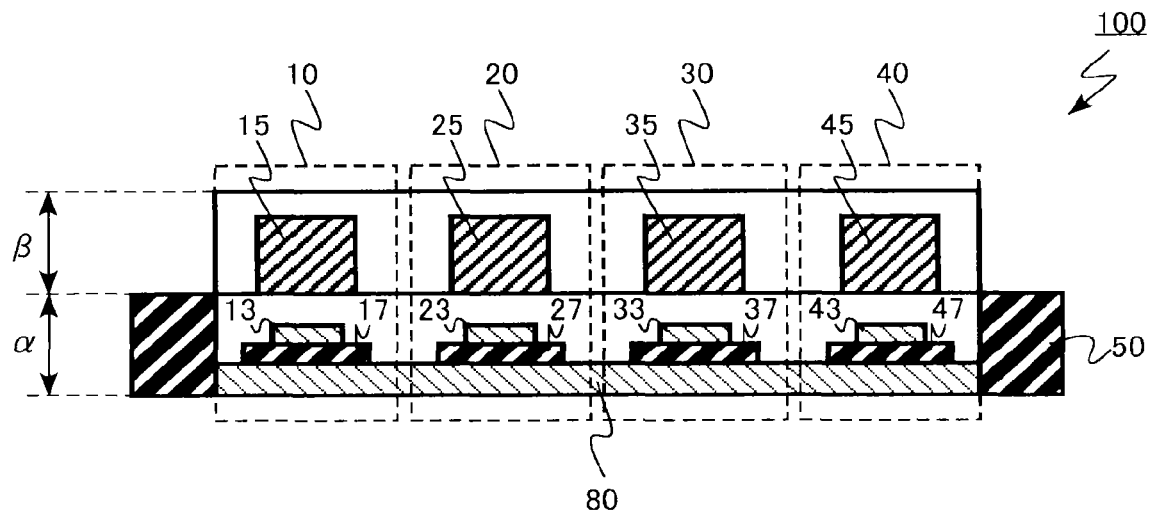

FIG. 1 is a circuit diagram of a semiconductor device of this embodiment. FIGS. 2A and 2B are schematic views of the semiconductor device of this embodiment. FIG. 2A is a top view, and FIG. 2B is a cross-sectional view taken along the line A-A defined in FIG. 2A. FIG. 2A does not show the capacitor region β of the semiconductor device shown in FIG. 2B.

The semiconductor device 100 of this embodiment is a power semiconductor module (hereinafter also referred to simply as the module) housed in one resin package. In the semiconductor device of this embodiment, four circuit units, which are a first circuit unit 10, a second circuit unit 20, a third circuit unit 30, and a fourth circuit unit 40 are arranged on a substrate 80.

The first circuit unit 10 includes a first electrode 11a and a second electrode 12a. The first circuit unit 10 also includes a first electrode terminal 11b that connects the first electrode 11a to an external circuit, and a second electrode terminal 12b that connects the second electrode 12a to an external circuit.

A first switching element 13 and a second switching element 14 that are electrically connected in series are provided between the first electrode 11a and the second electrode 12a. The first switching element 13 and the second switching element 14 may be SiC (silicon carbide) MOSFETs (Metal Oxide Semiconductor Field Effect Transistors), for example.

The first electrode 11a is located on the source side of the first switching element 13. The second electrode 12a is located on the drain side of the second switching element 14. A first gate electrode 13a that controls the first switching element 13 is provided in the first switching element 13, and a second gate electrode 14a that controls the second switching element 14 is provided in the second switching element 14.

A freewheeling diode (not shown) may be provided in parallel with each of the first switching element 13 and the second switching element 14.

A capacitor 15 that is electrically connected in parallel to the first switching element 13 and the second switching element 14 is provided. The capacitor 13 has a function to reduce the parasitic inductance of the circuit loop of the first switching element 13, the second switching element 14, and the capacitor 15, by connecting the first electrode 11a and the second electrode 12a with low impedance with respect to the transient current generated at the time of switching of the first switching element 13 and the second switching element 14.

An AC electrode 16 connected between the first switching element 13 and the second switching element 14 is provided. The AC electrode 16 is connected to a load.

Like the first circuit unit 10, the second circuit unit 20 includes a first electrode 21a and a second electrode 22a. The second circuit unit 20 also includes a first electrode terminal 21b that connects the first electrode 21a to an external circuit, and a second electrode terminal 22b that connects the second electrode 22a to an external circuit.

A first switching element 23 and a second switching element 24 that are electrically connected in series are provided between the first electrode 21a and the second electrode 22a. The first switching element 23 and the second switching element 24 may be SiC MOSFETs, for example.

The first electrode 21a is located on the source side of the first switching element 23. The second electrode 22a is located an the drain side of the second switching element 24. A first gate electrode 23a that controls the first switching element 23 is provided in the first switching element 23, and a second gate electrode 24a that controls the second switching element 24 is provided in the second switching element 24.

A freewheeling diode (not shown) may be provided in parallel with each of the first switching element 23 and the second switching element 24.

A capacitor 25 that is electrically connected in parallel to the first switching element 23 and the second switching element 24 is provided. The capacitor 25 has a function to reduce the parasitic inductance of the circuit loop of the first switching element 23, the second switching element 24, and the capacitor 25, by connecting the first electrode 21a and the second electrode 22a with low impedance with respect to the transient current generated at the time of switching of the first switching element 23 and the second switching element 24.

An AC electrode 26 connected between the first switching element 23 and the second switching element 24 is provided. The AC electrode 26 is connected to a load.

Like the first circuit unit 10, the third circuit unit 30 includes a first electrode 31a and a second electrode 32a. The third circuit unit 30 else includes a first electrode terminal 31b that connects the first electrode 31a to an external circuit, and a second electrode terminal 32b that connects the second electrode 32a to an external circuit.

A first switching element 33 and a second switching element 34 that are electrically connected in series are provided between the first electrode 31a and the second electrode 32a. The first switching element 33 and the second switching element 34 may be SiC MOSFETs, for example.

The first electrode 31a is located on the source side of the first switching element 33. The second electrode 32a is located on the drain side of the second switching element 34. A first gate electrode 33a that controls the first switching element 33 is provided in the first switching element 33, and a second gate electrode 34a that controls the second switching element 34 is provided in the second switching element 34.

A freewheeling diode (not shown) may be provided in parallel with each of the first switching element 33 and the second switching element 34.

A capacitor 35 that is electrically connected in parallel to the first switching element 33 and the second switching element 34 is provided. The capacitor 35 has a function to reduce the parasitic inductance of the circuit loop of the first switching element 33, the second switching element 34, and the capacitor 35, by connecting it the first electrode 31a and the second electrode 32a with low impedance with respect to the transient current generated at the time of switching of the first switching element 33 and the second switching element 34.

An AC electrode 36 connected between the first switching element 33 and the second switching element 34 is provided. The AC electrode 36 is connected to a load.

Like the first circuit unit 10, the fourth circuit unit 40 includes a first electrode 41a and a second electrode 42a. The fourth circuit unit 40 also includes a first electrode terminal 41b that connects the first electrode 41a to an external circuit, and a second electrode terminal 42b that connects the second electrode 42a to an external circuit.

A first switching element 43 and a second switching element 44 that are electrically connected in series are provided between the first electrode 41a and the second electrode 42a. The first switching element 43 and the second switching element 44 may be SiC MOSFETs, for example.

The first electrode 41a is located on the source side of the first switching element 43. The second electrode 42a is located on the drain side of the second switching element 44. A first gate electrode 43a that controls the first switching element 43 is provided in the first switching element 43, and a second gate electrode 44a that controls the second switching element 44 is provided in the second switching element 44.

A freewheeling diode (not shown) may be provided in parallel with each of the first switching element 43 and the second switching element 44.

A capacitor 45 that is electrically connected in parallel to the first switching element 43 and the second switching element 44 is provided. The capacitor 45 has a function to reduce the parasitic inductance of the circuit loop of the first switching element 43, the second switching element 44, and the capacitor 45, by connecting the first electrode 41a and the second electrode 42a with low impedance with respect to the transient current generated at the time of switching of the first switching element 43 and the second switching element 44.

An AC electrode 46 connected between the first switching element 43 and the second switching element 44 is provided. The AC electrode 46 is connected to a load.

The semiconductor device 100 of this embodiment has a housing 50 that encloses at least the side surfaces of the first circuit unit 10, the second circuit unit 20, the third circuit unit 30, and the fourth circuit unit 40. The housing 50 has a function to mechanically protect the first through fourth circuit units 10, 20, 30, and 40. The housing 50 is made of resin such as epoxy resin.

A common potential is applied from outside to the first electrodes 11a, 21a, 31a, and 41a of the respective circuit units via the first electrode terminals 11b, 21b, 31b, and 41b. Here, the common potential is a ground potential. The first electrodes 11a, 21a, 31a, and 41a may be connected to one another in the module 100.

A common potential is also applied from outside to the second electrodes 12a, 22a, 32a, and 42a of the respective circuit units via the second electrode terminals 12b, 22b, 32b, and 42b. Here, the common potential is a positive voltage. The second electrodes 12a, 22a, 32a, and 42a may be connected to one another in the module 100.

The AC electrodes 16, 26, 36, and 46 of the respective circuit units are connected to one another, and are connected to an AC electrode terminal 52.

The first gate electrodes 13a, 23a, 33a, and 43a of the respective circuit units are connected to one another, and are connected to a first gate electrode terminal 54. The source sides of the first switching elements 13, 23, 33, and 43 of the respective circuit units are connected to one another, and are connected to a first source terminal 56 for a gate control circuit. The first gate electrode terminal 54 and the first source terminal 56 for a gate control circuit are connected to a first gate control circuit (not shown).

The second gate electrodes 14a, 24a, 34a, and 44a of the respective circuit units are also connected to one another, and are connected to a second gate electrode terminal 58. The source sides of the second switching elements 14, 24, 34, and 44 of the respective circuit units are also connected to one another, and are connected to a second source terminal 60 for a gate control circuit. The second gate electrode terminal 58 and the second source terminal 60 for a gate control circuit are connected to a second gate control circuit (not shown).

As shown in FIG. 2B, the semiconductor device 100 has a switching element region α where the first switching elements 13, 23, 33, and 43, and the second switching elements 14, 24, 34, and 44 are placed, and a capacitor region β where the capacitors 15, 25, 35, and 45 are placed. The capacitor region β is located above the switching element region α. In other words, the capacitors 15, 25, 35, and 45 are located on the opposite sides of the first switching elements 13, 23, 33, and 43, and the second switching elements 14, 24, 34, and 44, from the substrate 80. With the switching element region α and the capacitor region β being stacked as described above, the semiconductor device 100 can be made smaller in size.

So as to improve heat release properties, the substrate 80 is preferably a conductor such as a metal. For example, the substrate 80 is copper.

When the substrate 80 is a conductor, insulators 17, 27, 37, and 47, which have ceramics insulator between front side and back side electrodes, are provided between the substrate 80 and the first and second switching elements 13, 23, 33, 43, 14, 24, 34, and 44.

For example, in a case where the ground potential terminals of the module and the terminals to which a positive voltage is applied are collectively connected to one capacitor, the self-inductance components of the parasitic inductance become larger. Also, as the current of the four switching elements flows in the parasitic inductance of the connection wire, the time rate (di/dt) of change in current becomes higher. Therefore, it is difficult to suppress the overshoot voltage at turn-off that is proportional to the time rate (di/dt) of change in the current flowing in the wire inductance (parasitic inductance) and the module.

In the semiconductor device 100 of this embodiment, the module is divided into circuit units that are connected in parallel. Capacitors are also divided and connected to the respective circuit units, and are included in the respective circuit units. Accordingly, the self-inductance components of the parasitic inductance become smaller by the amount equivalent to the number of the divided circuit units, compared with the self-inductance components in a case where the terminals are collectively connected to one capacitor. Furthermore, a current in accordance with the number of switching elements flows in each circuit unit, and accordingly, the time rate (di/dt) of change in current becomes lower.

With this structure, di/dt of the parasitic inductance and the circuit units becomes lower, and accordingly, overshoot can be suppressed. Also, as overshoot is suppressed, switching speed can be increased, and switching loss (∫ixvxdt) can be reduced.

Although the number of circuit units is four in the above described example, the number of circuit units is not limited to four, and any number of circuit units may be used, as long as the number is greater than one. For example, the number of circuit units to be placed in parallel may be selected in accordance with the capacity required in the module.

So as to suppress overshoot and reduce switching loss, the number of circuit units is preferably selected so that the current flowing in each circuit unit will be 100 A (amperes) or less.

Figure 3:
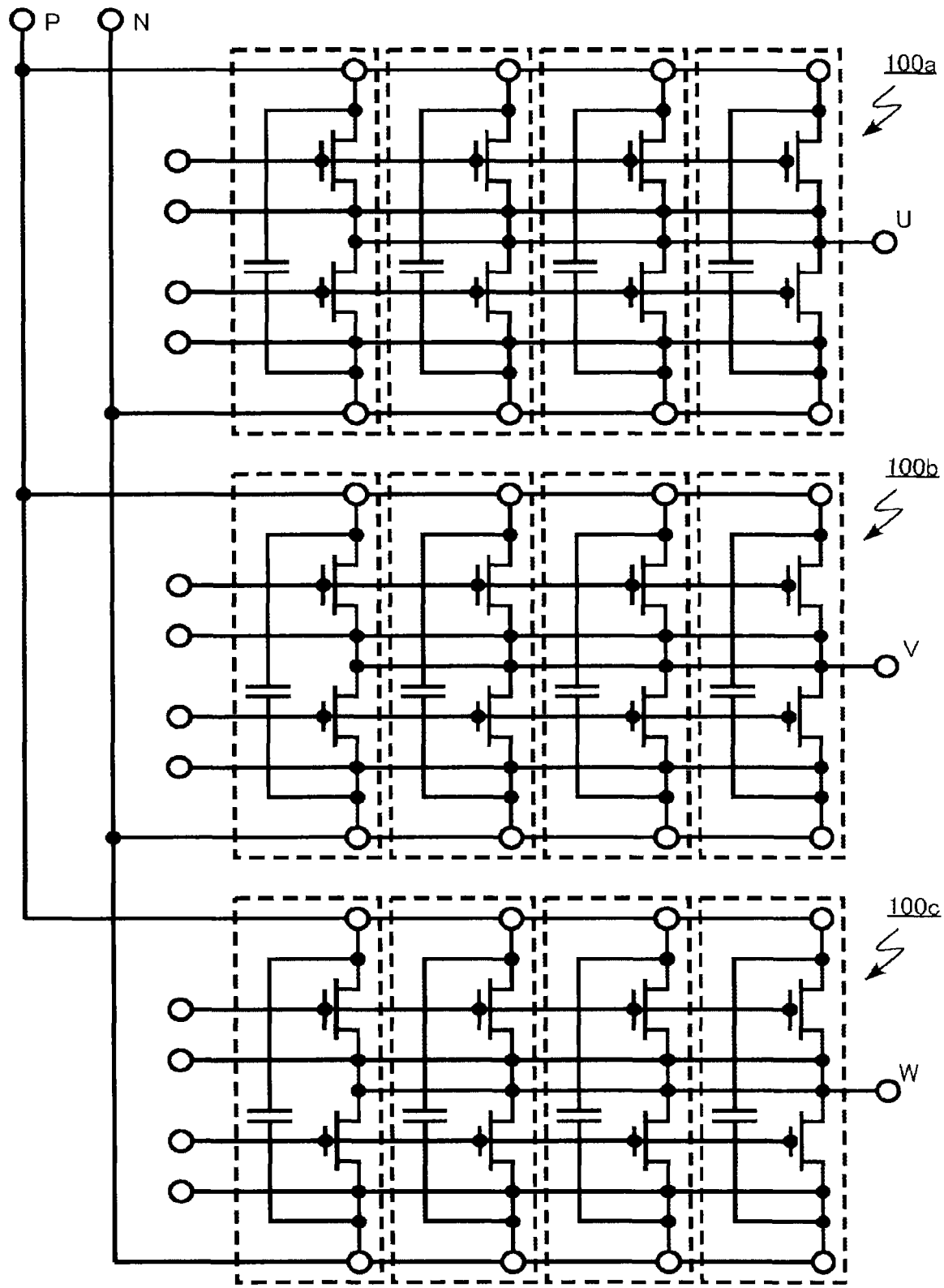
FIG. 3 is a circuit diagram of an inverter circuit using semiconductor devices of the first embodiment.

FIG. 3 is a circuit diagram of an inverter circuit using semiconductor devices of this embodiment. A three-phase inverter circuit that includes three AC electrode terminals U, V, and W is realized by connecting three modules 100a, 100b, and 100c, each of which has the same structure as the module 100 of this embodiment, in parallel between a negative-voltage terminal (N) and a positive-voltage terminal (P). In this three-phase inverter circuit, overshoot is also suppressed, and switching loss is also reduced.

Second Embodiment

A semiconductor device of this embodiment is the same as the semiconductor device of the first embodiment, except that a magnetic shielding panel of a conductor is provided between each two adjacent circuit units. Therefore, explanation of the same aspects as those of the first embodiment will not be repeated.

Figure 4A:
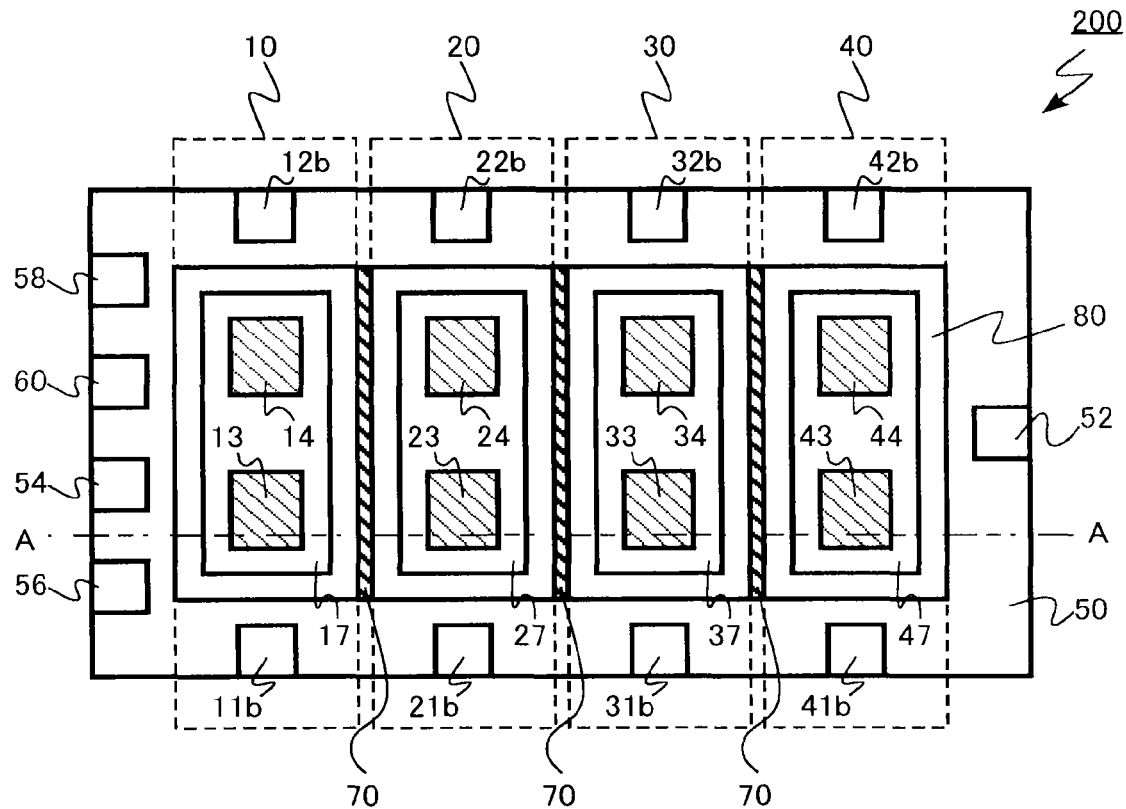
FIGS. 4A and 4B are schematic views of a semiconductor device of a second embodiment.
Figure 4B:
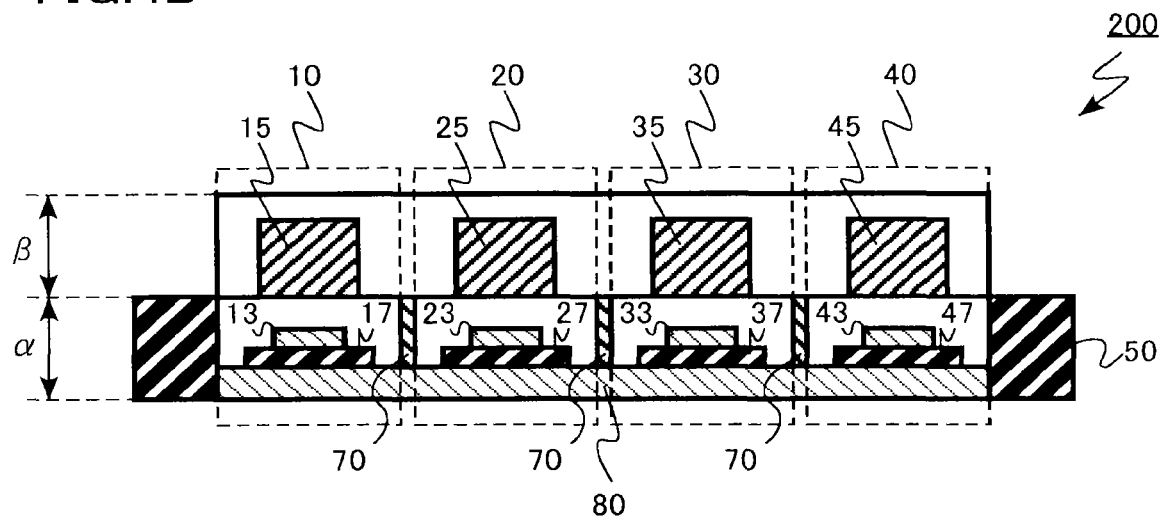

FIGS. 4A and 4B are schematic views of the semiconductor device of this embodiment. FIG. 4A is a top view, and FIG. 4B is a cross-sectional view taken along the line A-A defined in FIG. 4A. FIG. 4A does not show the capacitor region β of the semiconductor device shown in FIG. 4B.

In the semiconductor device 200 of this embodiment, magnetic shielding panels 70 are provided between adjacent circuit units: specifically, between a first circuit unit 10 and a second circuit unit 20, between the second circuit unit 20 and a third circuit unit 30, and between the third circuit unit 30 and a fourth circuit unit 40. So as to improve magnetic shielding properties, the magnetic shielding panels 70 are preferably provided continuously between facing inner side surfaces of the housing 50, as shown in FIG. 4A.

The magnetic shielding panels 70 are made of a metal, for example. The metal may be aluminum, for example.

The magnetic shielding panels 70 may be flat panels or mesh panels, for example.

In the semiconductor device 200 of this embodiment, the magnetic shielding panels 70 are provided to prevent flux linkage between the circuit units. Accordingly, the mutual inductance components of the parasitic inductance are reduced, and the parasitic inductance is reduced. As a result, the overshoot voltage at turn-off that is proportional to the time rate (di/dt) of change in the current flowing in the wire inductance (parasitic inductance) and the module is suppressed. Also, as the overshoot is suppressed, switching speed can be further increased, and switching loss (∫ixvxdt) can be reduced.

Although the first switching elements and the second switching elements are MOSFETs in the above described embodiments, IGBTs (Insulated Gate Bipolar Transistors) or HEMTs (High Electron Mobility Transistors) may also be used.

Although the semiconductor material of the first switching elements and the second switching elements is SiC (silicon carbide) in the above described embodiments, it is possible to use Si (silicon), GaN (gallium nitride), or the like.

While certain embodiments have been described, these embodiments have been presented by way of example only, and are not intended to limit the scope of the inventions. Indeed, the semiconductor device described herein may be embodied in a variety of other forms; furthermore, various emissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate;
   a plurality of circuit units arranged above the substrate, each of the circuit units including a first electrode, a second electrode, a first switching element and a second switching element electrically connected in series between the first electrode and the second electrode, the first switching unit having a first gate electrode and the second switching unit having a second gate electrode, a capacitor electrically connected in parallel to the first switching element and the second switching element between the first electrode and the second electrode, and an AC electrode connected between the first switching element and the second switching element; and
   a housing enclosing the circuit units,
   wherein a common potential is applied to the first electrodes of the circuit units, a common potential is applied to the second electrodes of the circuit units, the AC electrodes of the circuit units are connected to one another, the first gate electrodes of the circuit units are connected to one another, and the second gate electrodes of the circuit units are connected to one another.

2. A semiconductor device comprising:
   a substrate;
   a plurality of circuit units arranged above the substrate, each of the circuit units including a first electrode, a second electrode, a first switching element and a second switching element electrically connected in series between the first electrode and the second electrode, a capacitor electrically connected in parallel to the first switching element and the second switching element between the first electrode and the second electrode, and an AC electrode connected between the first switching element and the second switching element; and
   a housing enclosing the circuit units,
   wherein a magnetic shielding panel of a conductor is provided between each two adjacent ones of the circuit units.

3. The device according to claim 1, wherein the first switching element and the second switching element is one of a MOSFET and an IGBT.

4. The device according to claim 1, wherein the housing is made of resin.

5. The device according to claim 2, wherein the magnetic shielding panel is continuously formed between facing inner side surfaces of the housing.

6. The device according to claim 2, wherein the magnetic shielding panel is made of aluminum.

7. The device according to claim 1, wherein the substrate is a conductor.

8. The device according to claim 1, wherein the substrate is a conductor, and an insulator is provided between the substrate and the first and second switching elements.

9. The device according to claim 1, wherein the capacitor is located above the first switching element and the second switching element.

10. The device according to claim 1, wherein each of the circuit units further includes a first gate electrode configured to control the first switching element, and a second gate electrode configured to control the second switching element.

* * * * *